(12) United States Patent
Lin et al.

(10) Patent No.: US 10,483,211 B2
(45) Date of Patent: Nov. 19, 2019

(54) FAN-OUT PACKAGE STRUCTURE AND METHOD FOR FORMING THE SAME

(71) Applicant: MEDIATEK INC., Hsin-Chu (TW)

(72) Inventors: Tzu-Hung Lin, Zhubei (TW); I-Hsuan Peng, Hsinchu (TW); Ching-Wen Hsiao, Hsinchu (TW); Nai-Wei Liu, Kaohsiung (TW); Wei-Che Huang, Zhudong Township, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/418,896

(22) Filed: Jan. 30, 2017

(65) Prior Publication Data

US 2017/0243826 A1     Aug. 24, 2017

Related U.S. Application Data

(60) Provisional application No. 62/297,995, filed on Feb. 22, 2016.

(51) Int. Cl.
*H01L 23/538* (2006.01)
*H01L 25/16* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/3128* (2013.01); *H01L 23/49811* (2013.01); *H01L 23/5383* (2013.01); *H01L 23/5384* (2013.01); (Continued)

(58) Field of Classification Search
CPC . H01L 25/0657; H01L 25/043; H01L 25/071; H01L 25/0652
USPC .................................................. 257/686, 774
See application file for complete search history.

(56) References Cited

U.S. PATENT DOCUMENTS 8,536,462 B1 *  9/2013  Darveaux .............. H05K 1/181
                                                        174/254
9,543,242 B1 *  1/2017  Kelly ................ H01L 23/49816
(Continued)

FOREIGN PATENT DOCUMENTS

CN          102646668 A      8/2012
EP          2 937 900 A2    10/2015
(Continued)

*Primary Examiner* — David Vu
*Assistant Examiner* — Brandon C Fox
(74) *Attorney, Agent, or Firm* — Wolf, Greenfield & Sacks, P.C.

(57) ABSTRACT

A semiconductor package structure including a first semiconductor package is provided. The first semiconductor package includes a first redistribution layer (RDL) structure having a first surface and a second surface opposite thereto. A first semiconductor die is disposed on and electrically coupled to the first surface of the first RDL structure. A first molding compound is disposed on the first surface of the first RDL structure and surrounds the first semiconductor die. A plurality of solder balls or conductive pillar structures is disposed in the first molding compound and electrically coupled to the first semiconductor die through the first RDL structure. A method for forming the semiconductor package is also provided.

28 Claims, 11 Drawing Sheets

(51) Int. Cl.
    *H01L 21/48*     (2006.01)
    *H01L 21/56*     (2006.01)
    *H01L 23/31*     (2006.01)
    *H01L 25/065*     (2006.01)
    *H01L 25/10*     (2006.01)
    *H01L 25/00*     (2006.01)
    *H01L 49/02*     (2006.01)
    *H01L 23/498*     (2006.01)
    *H01L 23/00*     (2006.01)

(52) U.S. Cl.
    CPC ...... *H01L 23/5386* (2013.01); *H01L 25/0657* (2013.01); *H01L 25/105* (2013.01); *H01L 25/16* (2013.01); *H01L 25/50* (2013.01); *H01L 28/10* (2013.01); *H01L 28/20* (2013.01); *H01L 28/40* (2013.01); *H01L 21/568* (2013.01); *H01L 24/16* (2013.01); *H01L 24/32* (2013.01); *H01L 24/48* (2013.01); *H01L 24/73* (2013.01); *H01L 24/81* (2013.01); *H01L 2224/0401* (2013.01); *H01L 2224/16238* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/81005* (2013.01); *H01L 2225/0651* (2013.01); *H01L 2225/06568* (2013.01); *H01L 2225/06582* (2013.01); *H01L 2225/1023* (2013.01); *H01L 2225/1035* (2013.01); *H01L 2225/1058* (2013.01); *H01L 2225/1088* (2013.01); *H01L 2924/00014* (2013.01); *H01L 2924/1431* (2013.01); *H01L 2924/1432* (2013.01); *H01L 2924/1436* (2013.01); *H01L 2924/15192* (2013.01); *H01L 2924/15311* (2013.01); *H01L 2924/15331* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/37001* (2013.01)

(56) References Cited

U.S. PATENT DOCUMENTS

| | | | |
|---|---|---|---|
| 2011/0024916 A1* | 2/2011 | Marimuthu | H01L 21/565 257/774 |
| 2012/0211885 A1 | 8/2012 | Choi et al. | |
| 2012/0217642 A1* | 8/2012 | Sun | H01L 25/16 257/773 |
| 2013/0075936 A1* | 3/2013 | Lin | H01L 24/19 257/777 |
| 2014/0084416 A1 | 3/2014 | Kang | |
| 2014/0103527 A1* | 4/2014 | Marimuthu | H01L 21/6835 257/737 |
| 2014/0124949 A1* | 5/2014 | Paek | H01L 23/49827 257/774 |
| 2015/0041987 A1 | 2/2015 | Yew et al. | |
| 2015/0125999 A1 | 5/2015 | Lee et al. | |
| 2015/0130084 A1* | 5/2015 | Liao | H01L 21/30604 257/779 |
| 2016/0056100 A1* | 2/2016 | Yeh | H01L 24/81 257/676 |
| 2016/0276307 A1* | 9/2016 | Lin | H01L 21/561 |
| 2017/0141041 A1* | 5/2017 | Lin | H01L 23/3114 |
| 2017/0141053 A1* | 5/2017 | Chen | H01L 21/565 |
| 2017/0207197 A1* | 7/2017 | Yu | H01L 23/481 |

FOREIGN PATENT DOCUMENTS

| | | |
|---|---|---|
| TW | 201436684 A | 9/2014 |
| TW | 201543642 A | 11/2015 |
| TW | 201545303 A | 12/2015 |
| TW | 201603234 A | 1/2016 |

\* cited by examiner

FAN-OUT PACKAGE STRUCTURE AND METHOD FOR FORMING THE SAME

CROSS REFERENCE TO RELATED APPLICATIONS

This application claims the benefit of U.S. Provisional Application No. 62/297,995 filed on Feb. 22, 2016, the entirety of which is incorporated by reference herein.

BACKGROUND OF THE INVENTION

Field of the Invention

The present invention relates to semiconductor package technology, and in particular to a fan-out package structure.

Description of the Related Art

In recent years, as electronic products have been become increasingly multifunctional and have been scaled down in size, there is a desire for manufacturers of semiconductor devices to make more devices that are formed on a single semiconductor wafer, so that the electronic products that include these devices can be made more compact. In response to such demands, a Package-on-package (PoP) technique was developed. The PoP technique enables two or more packages to be installed atop one another, i.e. stacked, with a standard interface to route signals between them. This allows higher component density in electronic products, such as mobile phones, personal digital assistants (PDAs), and digital cameras.

In such a PoP structure, through vias (which are sometimes referred to as through package vias (TPVs) or through interposer vias (TIVs)) which pass through a molding compound are typically employed to electrically connect the stacked packages. The formation process for TPVs/TIVs at least includes a lithography process to form TPV/TIV openings and a plating process to fill these openings with a conductive material. A molding process and a grinding process are then performed to form the TPVs/TIVs.

However, such processes for the formation of TPVs/TIVs are complicated and expensive. As a result, it is difficult to reduce manufacturing costs for semiconductor packages. Thus, a novel semiconductor package structure is desirable.

BRIEF SUMMARY OF THE INVENTION

Semiconductor package structures and methods for forming the same are provided. An exemplary embodiment of a semiconductor package structure includes a first semiconductor package. The first semiconductor package includes a first redistribution layer (RDL) structure having a first surface and a second surface opposite thereto. A first semiconductor die is disposed on and electrically coupled to the first surface of the first RDL structure. A first molding compound is disposed on the first surface of the first RDL structure and surrounds the first semiconductor die. A plurality of solder balls is embedded in the first molding compound and electrically coupled to the first semiconductor die through the first RDL structure. The first molding compound includes a plurality of openings to correspondingly expose the plurality of solder balls.

Another exemplary embodiment of a semiconductor package structure includes a first semiconductor package. The first semiconductor package includes a first RDL structure having a first surface and a second surface opposite thereto. A first semiconductor die is disposed on and electrically coupled to the first surface of the first RDL structure. A first molding compound is disposed on the first surface of the first RDL structure and surrounds the first semiconductor die. A plurality of conductive pillar structures is disposed in and exposed from the first molding compound. Each of the plurality of conductive pillar structures comprises a solder material that is bonded onto and electrically coupled to the first RDL structure.

An exemplary embodiment of a method for forming a semiconductor package structure including forming a first RDL structure on a carrier substrate. The first RDL structure has a first surface and a second surface opposite thereto and the second surface of the first RDL structure is attached to the carrier substrate. A plurality of solder balls is formed on the first surface of the first RDL structure. A first semiconductor die is mounted onto the first surface of the first RDL structure. The first semiconductor die is electrically coupled to the plurality of solder balls through the first RDL structure. A first molding compound is formed on the first surface of the first RDL structure, such that the first semiconductor die and the plurality of solder balls are embedded in the first molding compound. A plurality of openings is formed in the first molding compound to correspondingly expose the plurality of solder balls.

Another exemplary embodiment of a method for forming a semiconductor package structure including forming a first RDL structure on a carrier substrate. The first RDL structure has a first surface and a second surface opposite thereto and the second surface of the first RDL structure is attached to the carrier substrate. A plurality of conductive pillar structures is formed on the first RDL structure. Each of the plurality of conductive pillar structures includes a solder material that is bonded onto and electrically coupled to the first RDL structure. A first semiconductor die is mounted onto the first surface of the first RDL structure. The first semiconductor die is electrically coupled to the plurality of conductive pillar structures through the first RDL structure. A first molding compound is formed on the first surface of the first RDL structure, such that the first semiconductor die and the plurality of conductive pillar structures are in the first molding compound. The plurality of conductive pillar structures is exposed from the first molding compound.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
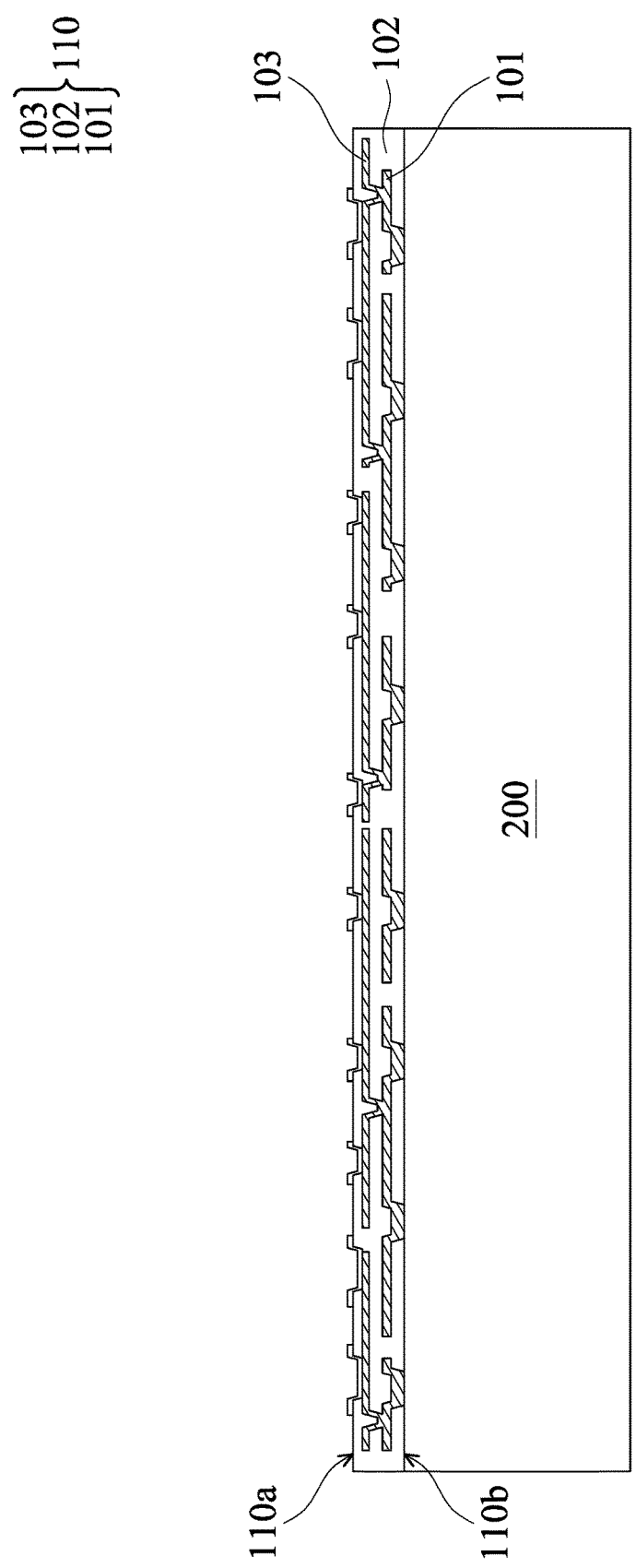
FIGS. 1A to 1E are cross-sectional views of an exemplary method for forming a semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
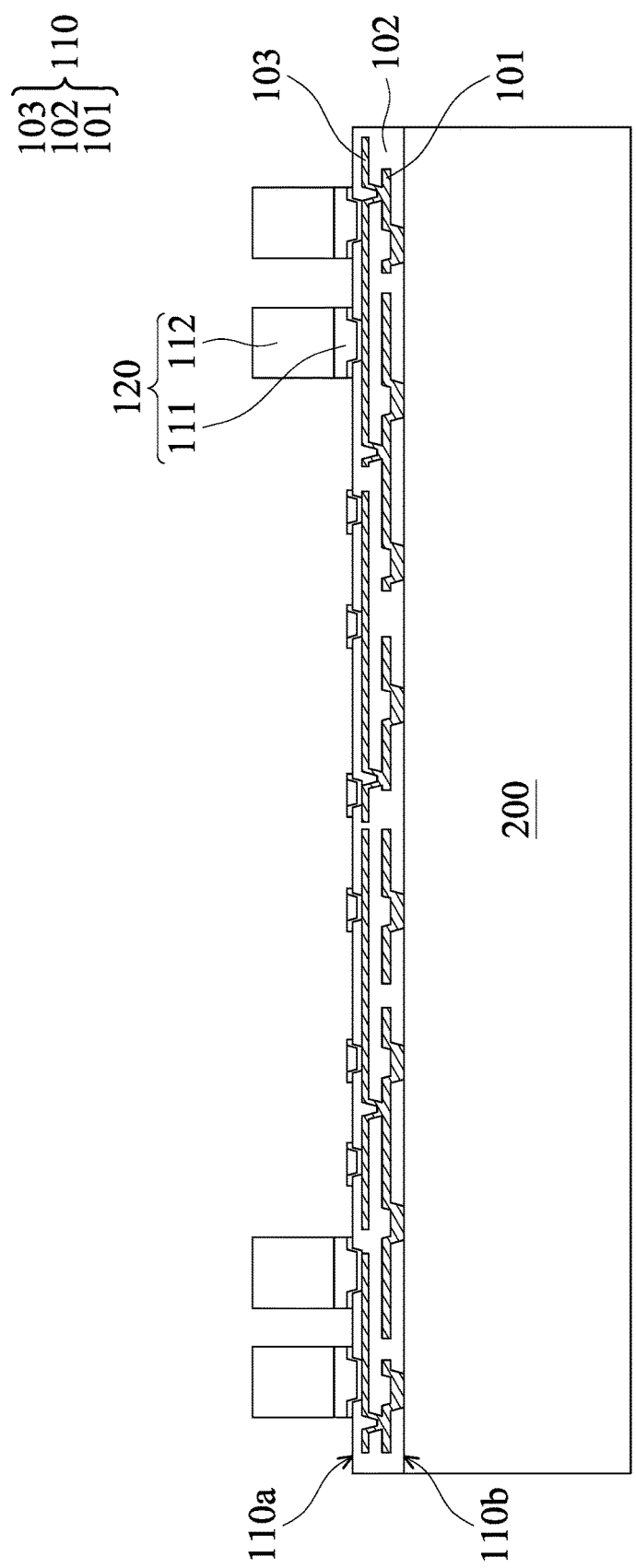
Figure 1C:
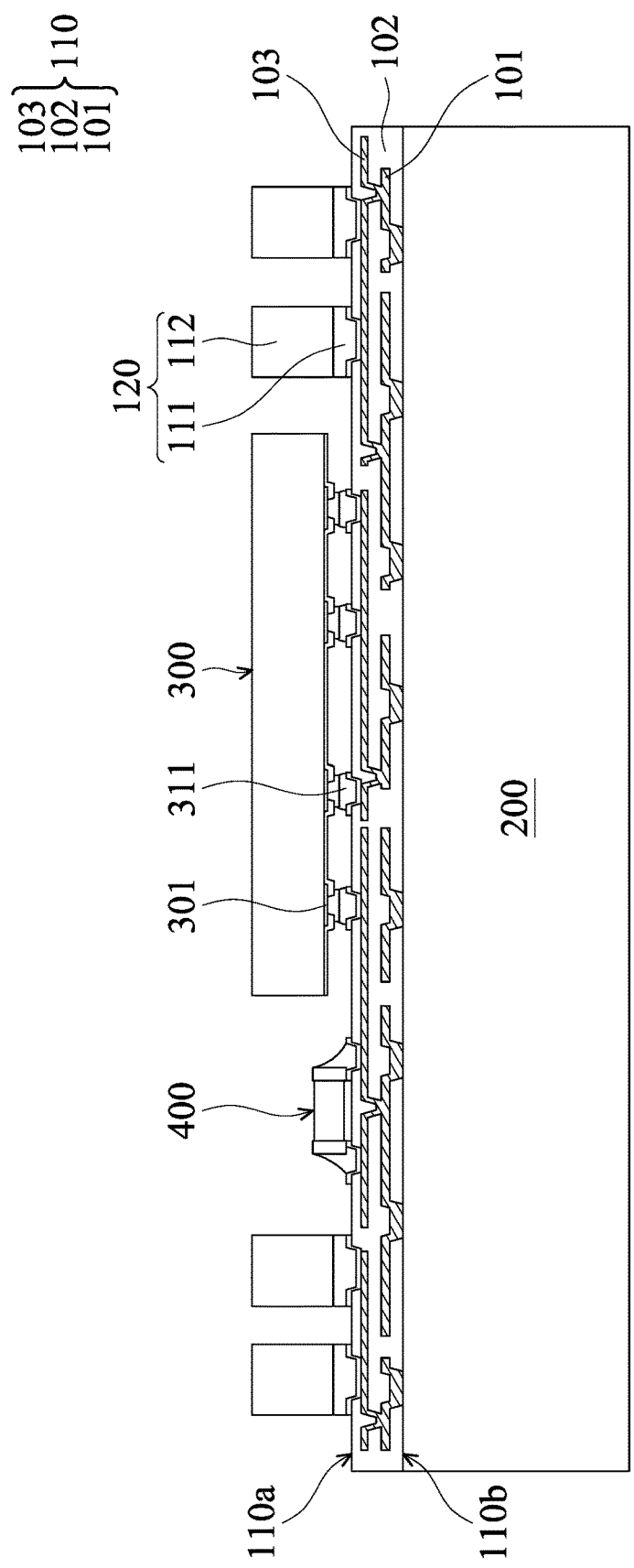
Figure 1D:
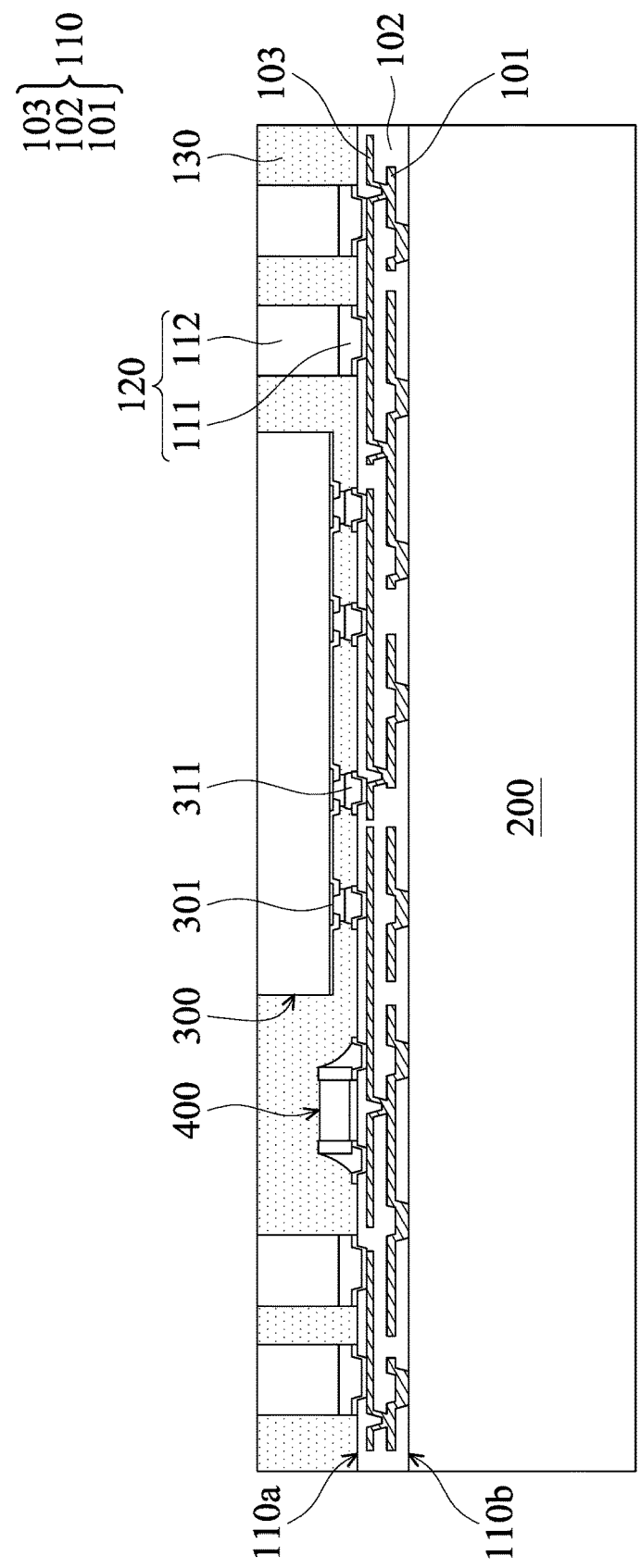
Figure 1E:
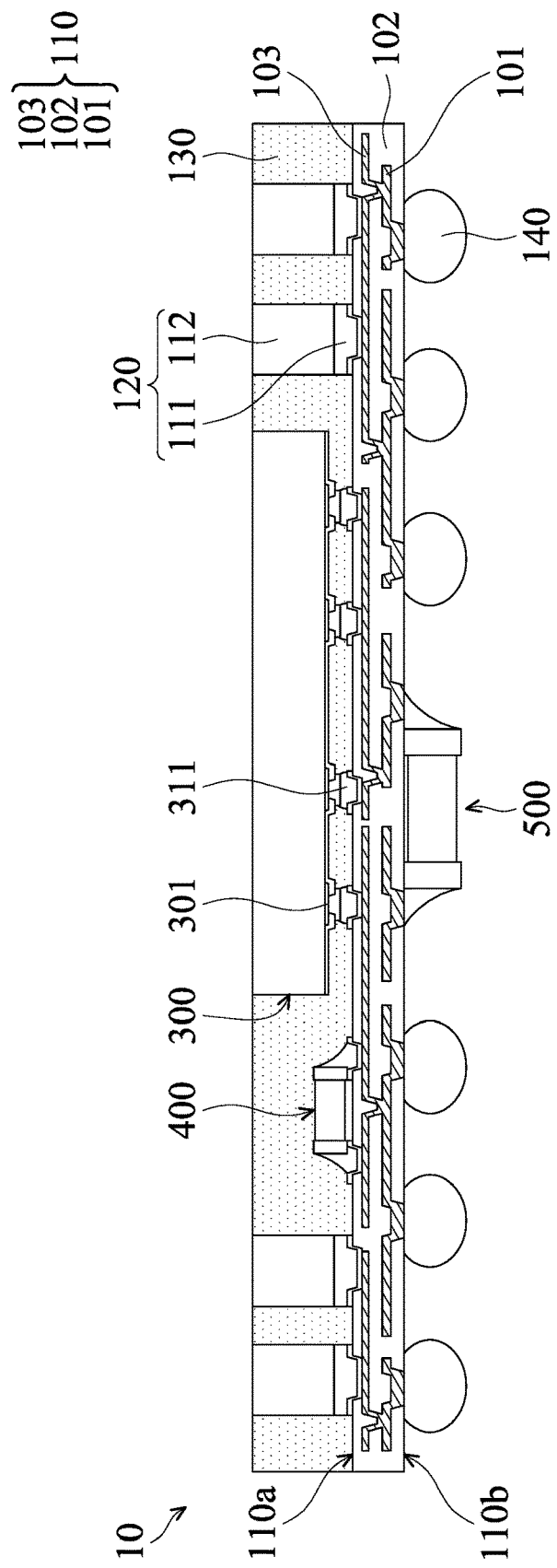

FIG. 1E is a cross-sectional view of a first semiconductor package 10 of a semiconductor package structure in accordance with some embodiments of the disclosure. In some embodiments, the semiconductor package structure is a flip-chip semiconductor package structure. Referring to FIG. 1E, the semiconductor package structure includes a first semiconductor package 10, that may be mounted on a base (not shown). In some embodiments, the first semiconductor package 10 may include a system-on-chip (SOC) package. Moreover, the base may include a printed circuit board (PCB) and may be formed of polypropylene (PP). In some embodiments, the base may include a package substrate. The first semiconductor package 10 of the semiconductor package structure is mounted on the base by a bonding process. For example, the first semiconductor package includes first conductive structures 140 that is mounted on and electrically coupled to the base by the bonding process.

The first semiconductor package 10 includes a first semiconductor die 300 (such as a SOC die) and a first redistribution layer (RDL) structure 110. The SOC die, for example, may include a logic die including a central processing unit (CPU), a graphics processing unit (GPU), a dynamic random access memory (DRAM) controller or any combination thereof.

As shown in FIG. 1E, pads 301 of the first semiconductor die 300 are electrically coupled to the circuitry (not shown) of the first semiconductor die 300. In some embodiments, the pads 301 belong to the uppermost metal layer of the interconnection structure (not shown) of the first semiconductor die 300. The pads 301 of the first semiconductor die 300 are in contact with the corresponding conductive structures 311, for example, conductive bumps, posts or solder pastes. It should be noted that the number of semiconductor dies integrated in the semiconductor package structure is not limited to that disclosed in the embodiment.

The first RDL structure 110, which is also referred to as a fan-out structure, has a first surface 110a and a second surface 110b opposite thereto. The first semiconductor die 300 is disposed on the first surface 110a of the first RDL structure 110. The first semiconductor die 300 is electrically coupled to the first RDL structure 110 through the conductive structures 311.

In the embodiment, the first RDL structure 110 includes one or more conductive traces disposed in an inter-metal dielectric (IMD) layer 102. For example, first conductive traces 103 are disposed at a first layer-level of the IMD layer 102 and at least one of the first conductive traces 103 is electrically coupled to the first semiconductor die 300. Moreover, second conductive traces 101 are disposed at a second layer-level that is different from the first layer-level of the IMD layer 102. In some embodiments, the IMD layer 102 may be a single layer or a multi-layer structure. Moreover, the IMD layer 102 may be formed of organic materials, which include a polymer base material, non-organic materials, which include silicon nitride ($SiN_x$), silicon oxide ($SiO_x$), graphene, or the like.

In some embodiments, the IMD layer 102 is a high-k dielectric layer (k is the dielectric constant of the dielectric layer). In some other embodiments, the IMD layer 102 may be formed of a photo sensitive material, which includes a dry film photoresist, or a taping film.

Pad portions of the second conductive traces 101 are exposed to openings of the IMD layer 102 and connected to the first conductive structures 140 that are disposed on the second surface 110b of the first RDL structure 110. Also, it should be noted that the number of conductive traces of the first RDL structure 110 shown in FIG. 1E is only an example and is not a limitation to the present invention.

In the embodiment, the first semiconductor package 10 further includes at least one electronic component 400, such as an integrated passive device (IPD), disposed on the first surface 110a of the first RDL structure 110. The IPD is electrically coupled to the first semiconductor die 300 through the first RDL structure 110. In some embodiments, the IPD may include a capacitor, an inductor, a resistor, or a combination thereof. Moreover, the IPD may be a capacitor that includes at least one electrode electrically coupled to one of the first conductive traces 103. Moreover, the first semiconductor package 10 may include at least one electronic component 500, such as an IPD, disposed on the second surface 110b of the first RDL structure 110. The IPD is also electrically coupled to the first semiconductor die 300 through the first RDL structure 110. Similarly, the electronic component 500 may be a capacitor that includes at least one electrode electrically coupled to one of the second conductive traces 101.

In the embodiment, as shown in FIG. 1E, the first semiconductor package 10 further includes a first molding compound 130 disposed on the first surface 110a of the first RDL structure 110 and surrounding the first semiconductor die 300. In some embodiments, the first molding compound 130 may be formed of an epoxy, a resin, a moldable polymer, or the like.

In the embodiment, the first semiconductor package 10 further includes through vias 120 embedded in and passing through the first molding compound 130. In some embodiments, the through vias 120 include conductive pillar structures disposed in and exposed from the first molding compound 130. The through vias 120 serve as TIVs or TPVs. In these cases, each of the conductive pillar structures includes a metal pillar 112 (e.g., copper pillar) and a solder material 111 that is bonded between one end of the metal pillar 112 and the pad portions of the first conductive traces 103 of the first RDL structure 110, such that the conductive pillar structures are electrically coupled to the first RDL structure 110. Moreover, the first semiconductor die 300 may be surrounded by the through vias 120.

The first conductive structures 140 are separated from the first molding compound 130 through the first RDL structure 110. In some embodiments, the first conductive structures 140 may include a conductive bump structure (such as a copper or solder bump structure), a conductive pillar structure, a conductive wire structure, or a conductive paste structure.

FIGS. 1A to 1E are cross-sectional views of an exemplary method for forming a semiconductor package structure in accordance with some embodiments of the disclosure. As shown in FIG. 1A, a carrier substrate 200 is provided. In some embodiments, the carrier substrate 200 may include a silicon or glass wafer. A first RDL structure 110 is formed on the carrier substrate 200 by deposition and patterning processes. In the embodiments, the first RDL structure 110 has a first surface 110a and a second surface 110b opposite thereto. The second surface 110b of the first RDL structure 110 is attached to the carrier substrate 200. In some embodiments, the first RDL structure 110 includes conductive traces disposed in an IMD layer 102. For example, first conductive traces 103 are disposed at a first layer-level of the IMD layer 102. Moreover, second conductive traces 101 are disposed at a second layer-level that is different from the first layer-level of the IMD layer 102.

As shown in FIG. 1B, through vias 120, such as conductive pillar structures, are formed on the first surface 110a of the first RDL structure 110. In some embodiments, each of the conductive pillar structures includes a metal pillar 112 (e.g., copper pillar) and a solder material 111 formed on one end of the metal pillar 112. In these cases, the conductive pillar structures are formed by a screen printing process, such that the conductive pillar structures are electrically coupled to the pad portions of the first conductive traces 103 of the first RDL structure 110 through the solder materials 111.

As shown in FIG. 1C, a first semiconductor die 300 and an optional electronic component 400 are mounted onto the first surface 110a of the first RDL structure 110, such that the first semiconductor die 300 and the electronic component 400 are electrically coupled to the through vias 120 (i.e., the conductive pillar structures) through the first RDL structure 110. In some embodiments, the first semiconductor die 300 and the electronic component 400 are surrounded by the through vias 120.

In some embodiments, the first semiconductor die 300 is a SOC die. The SOC die, for example, may include a logic die including a CPU, a GPU, a DRAM controller or any combination thereof and be mounted onto the first RDL structure 110 by flip-chip technology. The semiconductor die 300 includes pads 301 that are in contact with the corresponding conductive structures 311 (such as conductive bumps, posts or solder pastes, such that the first semiconductor die 300 is mounted onto the first conductive traces 103 of the first RDL structure 110 via the conductive structures 311.

In some embodiments, the electronic component 400 (such as a capacitor, an inductor, a resistor, or a combination thereof) is mounted onto the first RDL structure 110 by surface mount technology (SMT), such that the electronic component 400 is electrically coupled to the first conductive traces 103 of the first RDL structure 110.

As shown in FIG. 1D, a first molding compound 130 is formed on the first surface 110a of the first RDL structure 110 to entirely cover the first semiconductor die 300 and the through vias 120 (i.e., the conductive pillar structures). Namely, the first semiconductor die 300 and the through vias 120 are embedded in the first molding compound 130.

In some embodiments, the first molding compound 130 may be applied while substantially liquid, and then may be cured through a chemical reaction, such as in an epoxy or resin. In some other embodiments, the first molding compound 130 may be an ultraviolet (UV) or thermally cured polymer applied as a gel or malleable solid capable of being formed around the first semiconductor die 300 and the electronic component 400, and then may be cured through a UV or thermal curing process. The first molding compound 130 may be cured with a mold (not shown).

After the first molding compound 130 is formed, a grinding process, such as chemical mechanical polishing (CMP), is performed on the top surface of the first molding compound 130, such that the through vias 120 (i.e., conductive pillar structures) are exposed from the first molding compound 130. In some embodiments, the first semiconductor die 300 is also exposed from the first molding compound 130 after the grinding process is performed. In some embodiments, the first semiconductor die 300 is not exposed from the first molding compound 130 after the grinding process is performed.

As shown in FIG. 1E, the carrier substrate 200 is removed from the second surface 110b of the first RDL structure 110. Thereafter, an optional electronic component 500 that is the same as or different from the electronic component 400 is mounted onto the second surface 110b of the first RDL structure 110 by SMT, such that the electronic component 500 is electrically coupled to the pad portions of the second conductive traces 101 of the first RDL structure 110.

Moreover, first conductive structures 140 are formed on the second surface 110b of the first RDL structure 110, such that the first conductive structures 140 are electrically coupled to the pad portions of the second conductive traces 101 of the first RDL structure 110. As a result, the first semiconductor package 10 is completed. In some embodiments, the electronic component 500 is surrounded by the first conductive structures 140. Moreover, the first conductive structures 140 may include a conductive bump structure such as a copper bump or a solder bump structure, a conductive pillar structure, a conductive wire structure, or a conductive paste structure.

Figure 2:
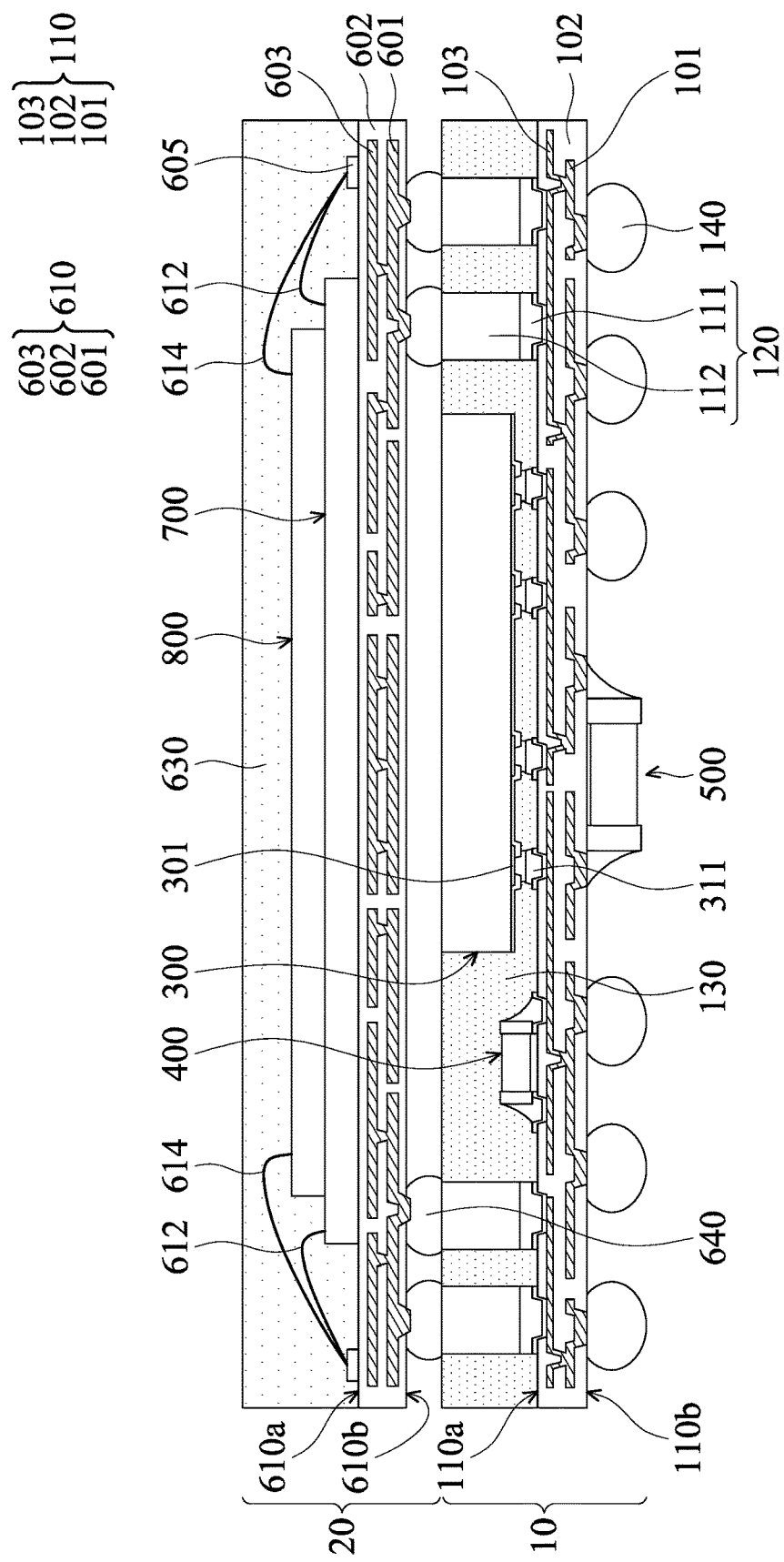
FIG. 2 is a cross-sectional view of an exemplary semiconductor package structure with a package on package (PoP) structure in accordance with some embodiments of the disclosure.

FIG. 2 is a cross-sectional view of an exemplary semiconductor package structure with a PoP structure in accordance with some embodiments of the disclosure. Descriptions of elements of the embodiments hereinafter that are the same as or similar to those previously described with reference to FIG. 1E are omitted for brevity. In the embodiment, the semiconductor package structure is similar to the semiconductor package structure shown in FIG. 1E, except that the semiconductor package structure further includes a second semiconductor package 20 stacked above the first semiconductor package 10 of the semiconductor package structure as shown in FIG. 1E. The second semiconductor package 20 may include a memory package, for example, a dynamic random access memory (DRAM) package.

As shown in FIG. 2, the first semiconductor package 10 of the semiconductor package structure shown in FIG. 1E is provided. A second RDL structure 610, which is also referred to as a fan-out structure, is formed above the first molding compound 130. In the embodiment, the structure and the formation of the second RDL structure 610 are similar to those of the first RDL structure 110. In the embodiments, the second RDL structure 610 has a third surface 610a and a fourth surface 610b opposite thereto. The fourth surface 610b of the second RDL structure 610 faces the first molding compound 130. In some embodiments, the second RDL structure 610 includes conductive traces disposed in an IMD layer 602 that is the same as or similar to the IMD layer 102. For example, third conductive traces 603 are disposed at a first layer-level of the IMD layer 602. Moreover, fourth conductive traces 601 are disposed at a second layer-level that is different from the first layer-level of the IMD layer 602.

In some embodiments, one or more semiconductor dies that include memory devices are successively stacked on the third surface 610a of the second RDL structure 610. For example, a second semiconductor die 700 (e.g., a DRAM die) is mounted onto the third surface 610a of the second RDL structure 610 with a paste (not shown). Moreover, a third semiconductor die 800 (e.g., a DRAM die) is stacked on the second semiconductor die 700 with a paste (not shown). The pads (not shown) of the second and third semiconductor dies 700 and 800 may be coupled to pads 605 of the second RDL structure 610 by bonding wires, such as bonding wires 612 and 614, respectively, so that the second and third semiconductor dies 700 and 800 are electrically coupled to the second RDL structure 610. It should be noted that the number of stacked semiconductor dies in the second semiconductor package 20 is not limited to the disclosed embodiment.

In some embodiments, a second molding compound 630 is formed on the third surface 610*a* of the second RDL structure 610 to entirely cover the second and third semiconductor dies 700 and 800, such that the second and third semiconductor dies 700 and 800 are surrounded by the second molding compound 630. Namely, the second and third semiconductor dies 700 and 800 are embedded in the second molding compound 630. The material and formation of the second molding compound 630 are the same as or similar to those of the first molding compound 130.

In some embodiments, after the second molding compound 630 is formed, second conductive structures 640 are formed on the fourth surface 610*b* of the second RDL structure 610. Thereafter, the second conductive structures 640 are bonded onto the exposed through vias 120 (i.e., conductive pillar structures) in the first molding compound 130, such that the first RDL structure 110 is electrically coupled to the second RDL structure 610 through the second conductive structures 640 and the through vias 120. As a result, the second semiconductor package 20 is completed and stacked above the first semiconductor package 10, so as to form the semiconductor package structure with a PoP structure.

According to the foregoing embodiments, the semiconductor package structure is designed to fabricate conductive pillar structures into the first semiconductor package for serving as TPVs/TIVs. The conductive pillar structures provide a compatible process for the semiconductor package structure.

Moreover, the conductive pillar structures are formed without using lithography and plating processes. Accordingly, the manufacturing cost of the semiconductor package structure is reduced. Moreover, since the RDL structure is formed prior to the mounting of the semiconductor die, a known good die (KGD) can be mounted onto the RDL structure, thereby increasing the yield of the semiconductor package structure.

Additionally, a passive device can be embedded in the molding compound, so as to provide design flexibility for the system integration of the semiconductor package structure.

Figure 3A:
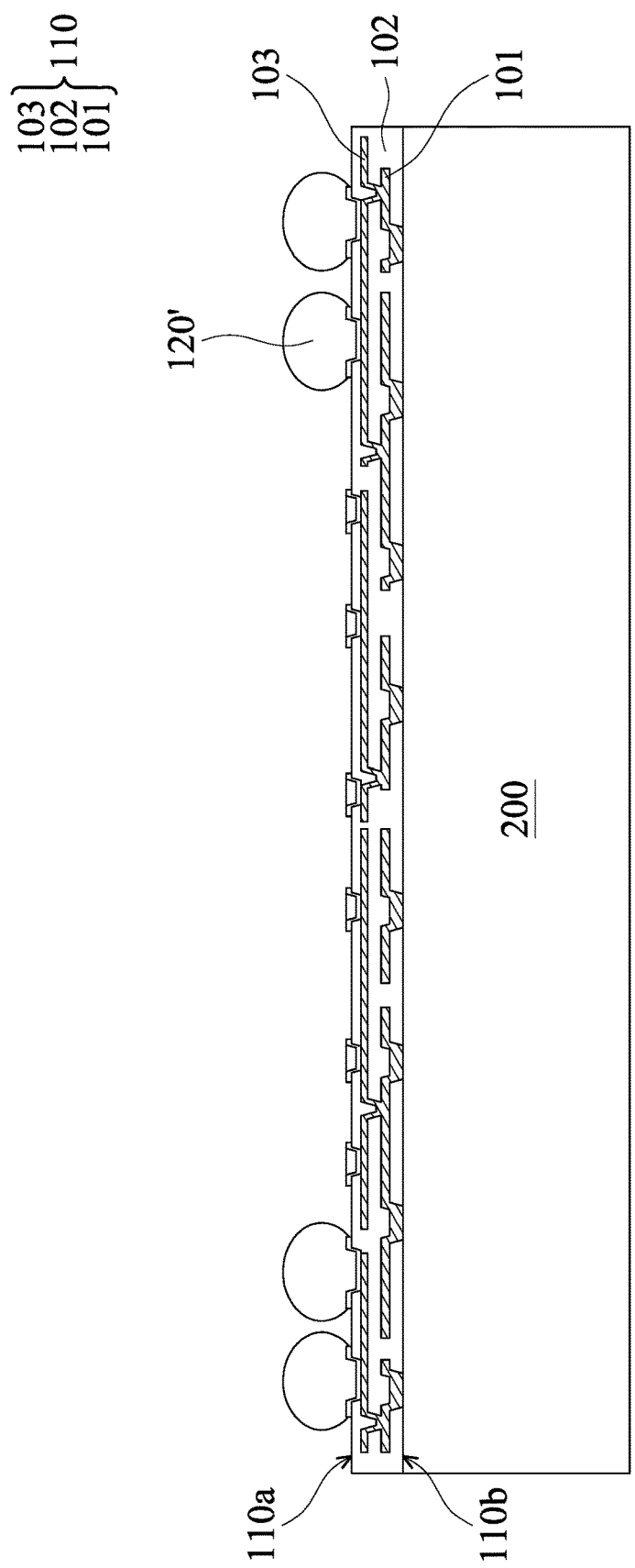
FIGS. 3A to 3D are cross-sectional views of an exemplary method for forming a semiconductor package structure in accordance with some embodiments of the disclosure.
Figure 3B:
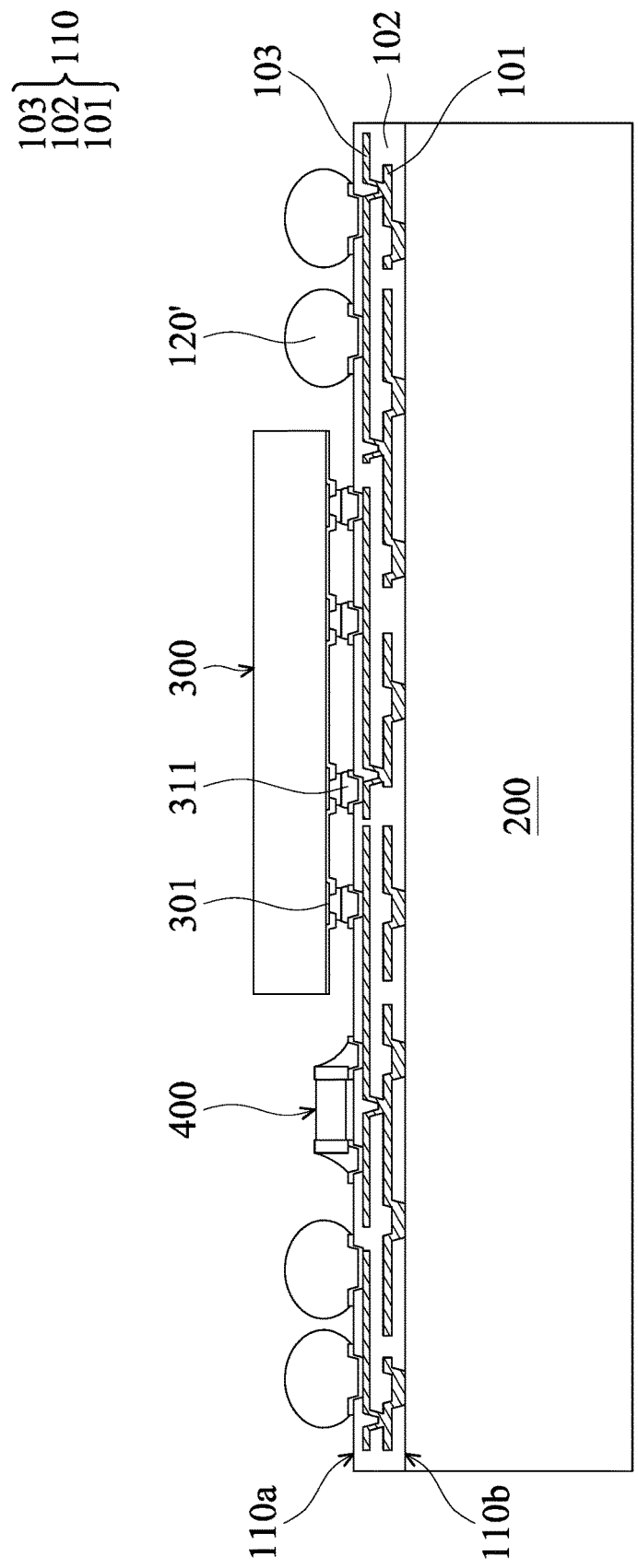
Figure 3C:
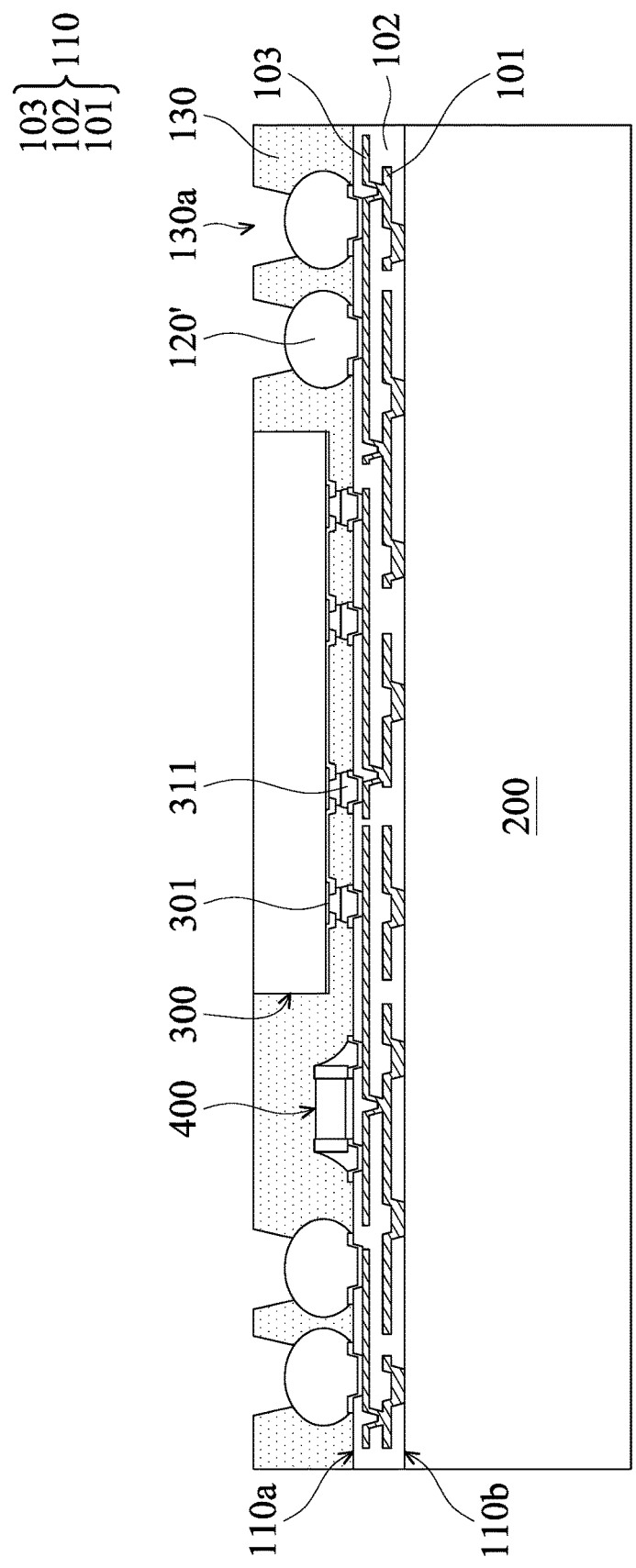
Figure 3D:
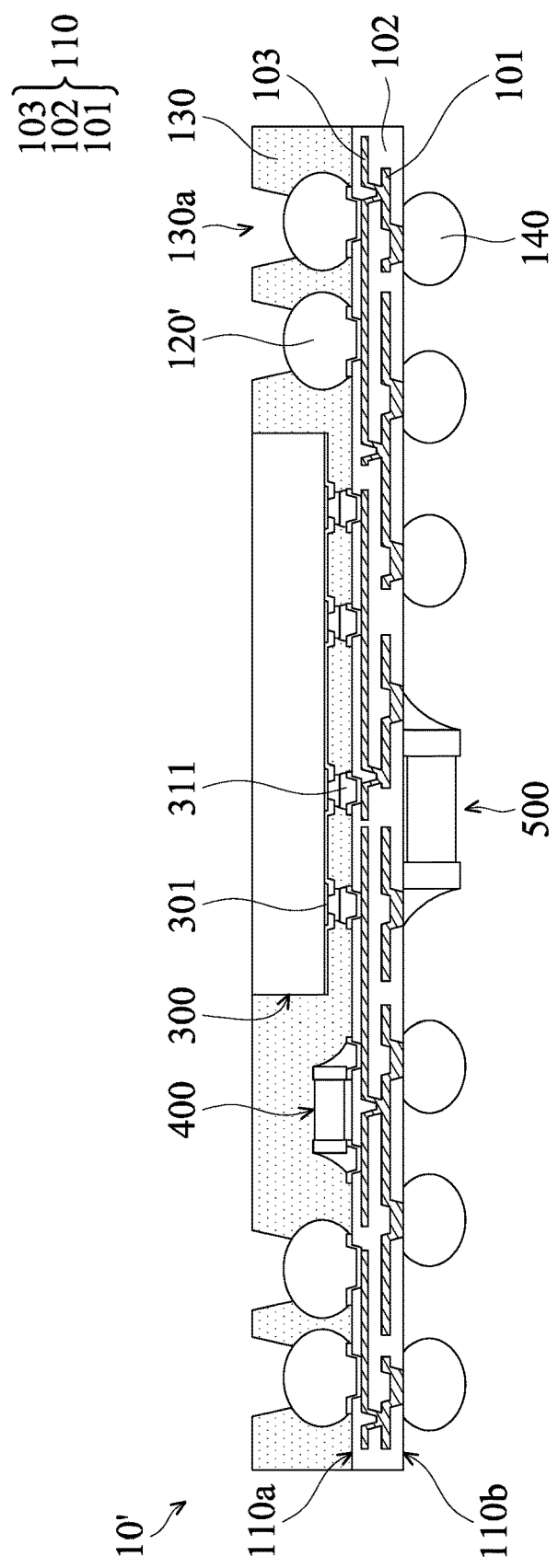

FIG. 3D is a cross-sectional view of a first semiconductor package 10' of a semiconductor package structure in accordance with some embodiments of the disclosure. Descriptions of elements of the embodiments hereinafter that are the same as or similar to those previously described with reference to FIG. 1E are omitted for brevity. In the embodiment, the first semiconductor package 10' of a semiconductor package structure is similar to the first semiconductor package 10 of a semiconductor package structure shown in FIG. 1E, except solder balls are employed to serve as through vias 120' (e.g., TPVs/TIVs) that are embedded in and exposed from the first molding compound 130.

In some embodiments, the first molding compound 130 includes openings 130*a*, and these openings 130*a* correspondingly expose the through vias 120' (i.e., solder balls), as shown in FIG. 3D. In these cases, each of the solder balls is bonded onto the pad portions of the first conductive traces 103 of the first RDL structure 110, such that the conductive pillar structures are electrically coupled to the first RDL structure 110. Moreover, the first semiconductor die 300 and the electronic component 400 may be surrounded by the through vias 120'.

FIGS. 3A to 3D are cross-sectional views of an exemplary method for forming a semiconductor package structure in accordance with some embodiments of the disclosure. Descriptions of elements of the embodiments hereinafter that are the same as or similar to those previously described with reference to FIGS. 1A to 1E are omitted for brevity. As shown in FIG. 3A, a structure as shown in FIG. 1E is provided.

Thereafter, through vias 120', such as solder balls, are formed on the first surface 110*a* of the first RDL structure 110, such that the solder balls are electrically coupled to the pad portions of first conductive traces 103 of the first RDL structure 110. In some embodiments, the solder balls are formed by a screen printing process.

As shown in FIG. 3B, a first semiconductor die 300 and an optional electronic component 400 may be mounted onto the first surface 110*a* of the first RDL structure 110 by the method shown in FIG. 1C, such that the first semiconductor die 300 and the electronic component 400 are electrically coupled to the through vias 120' (i.e., the solder balls) through the first RDL structure 110.

As shown in FIG. 3C, a first molding compound 130 may be formed on the first surface 110*a* of the first RDL structure 110 by the method shown in FIG. 1D. As a result, The first semiconductor die 300 and the through vias 120' (i.e., the solder balls) are entirely covered by the first molding compound 130.

In some embodiments, after the first molding compound 130 is formed, a laser drilling process is performed on the top surface of the first molding compound 130, so as to form openings 130*a* in the first molding compound 130 and correspondingly above the through vias 120' (i.e., solder balls). As a result, the through vias 120' are exposed from the first molding compound 130 via the openings 130*a*.

As shown in FIG. 3D, the carrier substrate 200 is removed from the second surface 110*b* of the first RDL structure 110. Thereafter, an optional electronic component 500 is mounted onto the second surface 110*b* of the first RDL structure 110. Moreover, first conductive structures 140 are formed on the second surface 110*b* of the first RDL structure 110. The electronic component 500 and the first conductive structures 140 may be formed by the method shown in FIG. 1E. As a result, the first semiconductor package 10' is completed.

Figure 4:
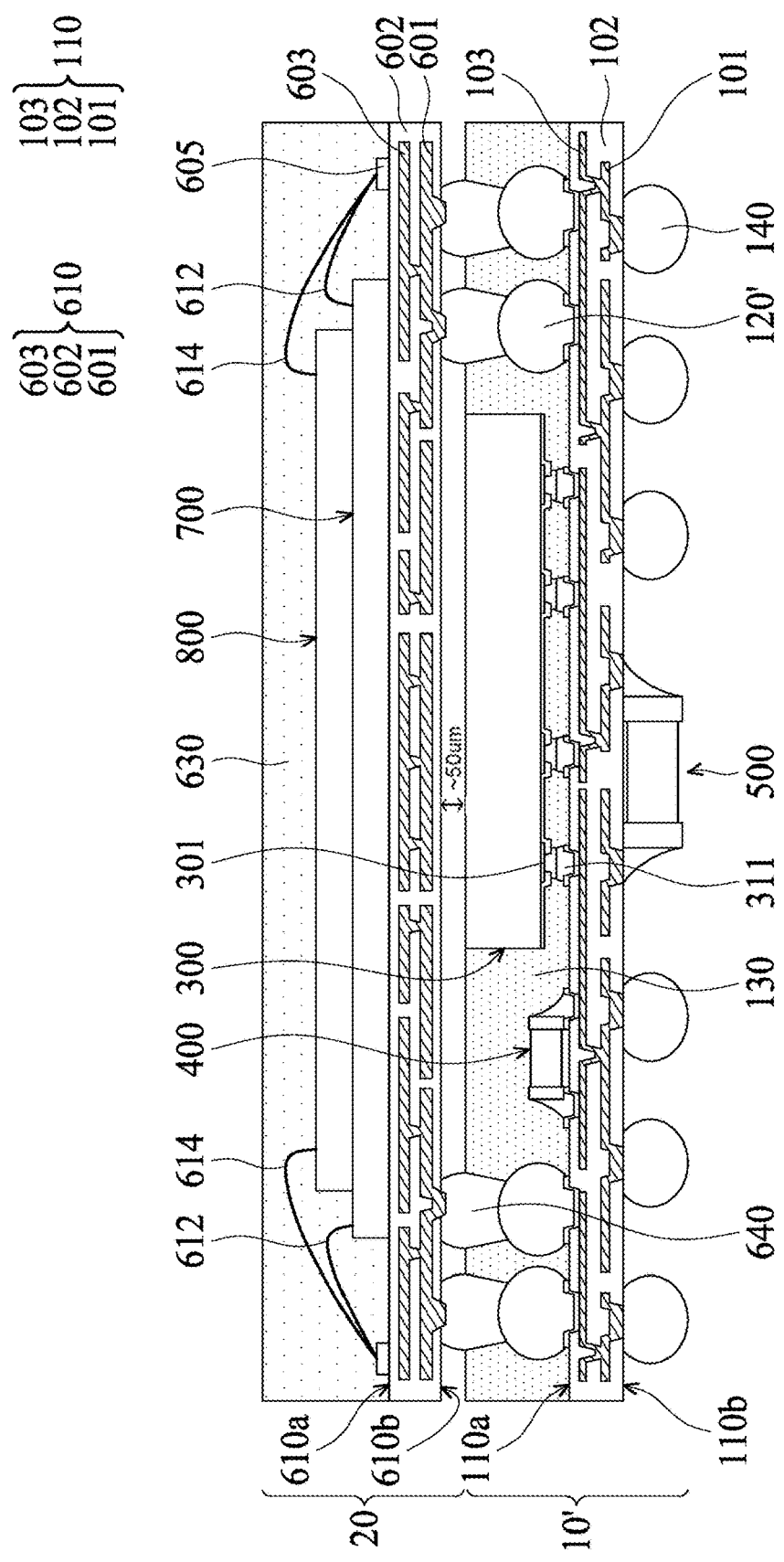
FIG. 4 is a cross-sectional view of an exemplary semiconductor package structure with a PoP structure in accordance with some embodiments of the disclosure.

FIG. 4 is a cross-sectional view of an exemplary semiconductor package structure with a PoP structure in accordance with some embodiments of the disclosure. Descriptions of elements of the embodiments hereinafter that are the same as or similar to those previously described with reference to FIGS. 2 and 3D are omitted for brevity. In the embodiment, the semiconductor package structure is similar to the semiconductor package structure shown in FIG. 2, except that the semiconductor package structure includes a first semiconductor package 10' as shown in FIG. 3D that is stacked below the second semiconductor package 20 of the semiconductor package structure as shown in FIG. 2.

As shown in FIG. 4, the first semiconductor package 10' of the semiconductor package structure as shown in FIG. 3D and a second semiconductor package 20 of the semiconductor package structure as shown in FIG. 2 are provided. The second semiconductor package 20 is bonded onto the first semiconductor package 10' through the second conductive structures 640. In some embodiments, the second conductive structures 640 on the fourth surface 610b of the second RDL structure 610 correspondingly fill the openings 130 to be in contact with the exposed through vias 120' (i.e., solder balls). As a result, the semiconductor package structure with a PoP structure is completed.

According to the foregoing embodiments, the semiconductor package structure is designed to fabricate solder balls into the first semiconductor package for serving as TPVs/TIVs. The solder balls provide a compatible process for the semiconductor package structure.

Moreover, the solder balls are formed without using lithography and plating processes. Accordingly, the manufacturing cost of the semiconductor package structure is reduced.

Moreover, since the RDL structure is formed prior to the mounting of the semiconductor die, a known good die can be mounted onto the RDL structure, thereby increasing the yield of the semiconductor package structure.

Furthermore, a passive device can be embedded in the molding compound, so as to provide design flexibility for the system integration of the semiconductor package structure.

Additionally, since the conductive structures on the fourth surface of the second RDL structure correspondingly fill the openings in the first molding compound, the gap between the first and second semiconductor packages can be reduced. As a result, the total height of the semiconductor package structure with a PoP structure can be further reduced. It is advantageous to the size reduction of electronic products.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a first semiconductor package, comprising:
   a first redistribution layer (RDL) structure having a first surface and a second surface opposite thereto;
   two electronic components respectively disposed on and electrically coupled to the first and second surface of the first RDL structure;
   a first semiconductor die disposed on and electrically coupled to the first surface of the first RDL structure;
   a first molding compound disposed on the first surface of the first RDL structure and surrounding the first semiconductor die;
   a plurality of screen printed solder balls embedded in the first molding compound and electrically coupled to the first semiconductor die through the first RDL structure;
   wherein the first molding compound comprises a plurality of openings to correspondingly expose the plurality of screen printed solder balls;
   wherein the semiconductor package structure further comprises a plurality of first conductive structures that fill the plurality of openings and are in contact with the plurality of screen printed solder balls; and
   wherein the semiconductor package structure further comprises a second semiconductor package coupled to the first semiconductor package by the plurality of first conductive structures, the second semiconductor package being spaced within 50 microns of the first semiconductor package.

2. The semiconductor package structure as claimed in claim 1, wherein a first electronic component of the two electronic components comprises a capacitor, an inductor, a resistor, or a combination thereof.

3. The semiconductor package structure as claimed in claim 1, wherein the first semiconductor package further comprises a plurality of second conductive structures disposed on and electrically coupled to the second surface of the first RDL structure.

4. The semiconductor package structure as claimed in claim 1,
   wherein the second semiconductor package is stacked above the first semiconductor package and wherein the second semiconductor package comprises:
   a second RDL structure electrically coupled to the first RDL structure and having a third surface and a fourth surface opposite thereto;
   a second semiconductor die disposed on and electrically coupled to the third surface of the second RDL structure; and
   a second molding compound disposed on the third surface of the second RDL structure and surrounding the second semiconductor die.

5. The semiconductor package structure as claimed in claim 4, wherein the second semiconductor package further comprises a third semiconductor die disposed on the second semiconductor die, surrounded by the second molding compound, and electrically coupled to the second RDL structure.

6. The semiconductor package structure as claimed in claim 5, wherein the second and third semiconductor dies comprise a memory device, respectively.

7. The semiconductor package structure as claimed in claim 4, wherein the plurality of first conductive structures are disposed on the fourth surface of the second RDL structure extending into the plurality of openings to be electrically coupled between the plurality of screen printed solder balls and the second RDL structure.

8. A semiconductor package structure, comprising:
   a first semiconductor package, comprising:
   a first RDL structure having a first surface and a second surface opposite thereto;
   a first semiconductor die disposed on and electrically coupled to the first surface of the first RDL structure;
   two electronic components respectively disposed on and electrically coupled to the first and second surface of the first RDL structure;
   a first molding compound disposed on the first surface of the first RDL structure and surrounding the first semiconductor die;
   a plurality of screen printed conductive pillar structures disposed in and exposed from the first molding compound, wherein each of the plurality of screen printed conductive pillar structures comprises a metal pillar and a solder material that is bonded between the metal pillar and the first RDL structure such that the plurality of screen printed conductive pillar structures are bonded onto and electrically coupled to the first RDL structure; and
   wherein the semiconductor package structure further comprises a second semiconductor package coupled to the first semiconductor package by a plurality of first conductive structures that are in contact with the plurality of screen printed conductive pillar structures, the second semiconductor package being spaced within 50 microns of the first semiconductor package.

9. The semiconductor package structure as claimed in claim 8, wherein a first electronic component of the two electronic components comprises a capacitor, an inductor, a resistor, or a combination thereof.

10. The semiconductor package structure as claimed in claim 8, wherein the first semiconductor package further comprises a plurality of second conductive structures disposed on and electrically coupled to the second surface of the first RDL structure.

11. The semiconductor package structure as claimed in claim 8, wherein the second semiconductor package is stacked above the first semiconductor package and wherein the second semiconductor package comprises:
 a second RDL structure electrically coupled to the first RDL structure and having a third surface and a fourth surface opposite thereto;
 a second semiconductor die disposed on and electrically coupled to the third surface of the second RDL structure; and
 a second molding compound disposed on the third surface of the second RDL structure and surrounding the second semiconductor die.

12. The semiconductor package structure as claimed in claim 11, wherein the second semiconductor package further comprises a third semiconductor die disposed on the second semiconductor die, surrounded by the second molding compound, and electrically coupled to the second RDL structure.

13. The semiconductor package structure as claimed in claim 12, wherein the second and third semiconductor dies comprise a memory device, respectively.

14. The semiconductor package structure as claimed in claim 11, wherein the plurality of first conductive structures are disposed between the fourth surface of the second RDL structure and the exposed plurality of screen printed conductive pillar structures, such that the plurality of first conductive structures are electrically coupled between the plurality of screen printed conductive pillar structures and the second RDL structure.

15. A method for forming a semiconductor package structure, comprising:
 forming a first semiconductor package structure, comprising:
  forming a first RDL structure on a carrier substrate, wherein the first RDL structure has a first surface and a second surface opposite thereto and the second surface of the first RDL structure is attached to the carrier substrate;
  screen printing a plurality of solder balls on the first surface of the first RDL structure;
  mounting a first semiconductor die and a first electronic component onto the first surface of the first RDL structure, wherein the first semiconductor die is electrically coupled to the plurality of solder balls through the first RDL structure;
  forming a first molding compound on the first surface of the first RDL structure, such that the first semiconductor die and the plurality of solder balls are embedded in the first molding compound;
  forming a plurality of openings in the first molding compound to correspondingly expose the plurality of solder balls;
  removing the carrier substrate from the first RDL structure;
  mounting a second electronic component onto the second surface of the first RDL structure after removing the carrier substrate; and
  forming a plurality of first conductive structures that fill the plurality of openings and are in contact with the plurality of solder balls; and
 coupling a second semiconductor package to the first semiconductor package structure by the plurality of first conductive structures, the second semiconductor package being spaced within 50 microns of the first semiconductor package structure.

16. The method as claimed in claim 15, wherein the first electronic component or the second electronic component comprises a capacitor, an inductor, a resistor, or a combination thereof.

17. The method as claimed in claim 15, further comprising forming a plurality of second conductive structures on the second surface of the first RDL structure.

18. The method as claimed in claim 15, further comprising:
 forming the second semiconductor package, comprising:
  forming a second RDL structure above the first molding compound, wherein the second RDL structure has a third surface and a fourth surface opposite thereto and the fourth surface of the second RDL structure faces the first molding compound;
  mounting a second semiconductor die on the third surface of the second RDL structure; and
  forming a second molding compound on the third surface of the second RDL structure, such that the second semiconductor die is surrounded by the second molding compound.

19. The method as claimed in claim 18, further comprising forming a third semiconductor die on the second semiconductor die, wherein the third semiconductor die is surrounded by the second molding compound.

20. The method as claimed in claim 19, wherein the second and third semiconductor dies comprise a memory device, respectively.

21. The method as claimed in claim 18, further comprising forming the plurality of first conductive structures on the fourth surface of the second RDL structure and in the plurality of openings, such that the plurality of first conductive structures are electrically coupled between the plurality of solder balls and the second RDL structure.

22. A method for forming a semiconductor package structure, comprising:
 forming a first semiconductor package structure, comprising:
  forming a first RDL structure on a carrier substrate, wherein the first RDL structure has a first surface and a second surface opposite thereto and the second surface of the first RDL structure is attached to the carrier substrate;
  screen printing a plurality of conductive pillar structures on the first RDL structure, wherein each of the plurality of conductive pillar structures comprises a metal pillar and a solder material that is bonded between the metal pillar and the first RDL structure such that the plurality of conductive pillar structures are bonded onto and electrically coupled to the first RDL structure;
  mounting a first semiconductor die and a first electronic component onto the first surface of the first RDL structure, wherein the first semiconductor die is electrically coupled to the plurality of conductive pillar structures through the first RDL structure;

forming a first molding compound on the first surface of the first RDL structure, such that the first semiconductor die and the plurality of conductive pillar structures are in the first molding compound, wherein the plurality of conductive pillar structures is exposed from the first molding compound;

removing the carrier substrate from the first RDL structure; and mounting a second electronic component onto the second surface of the first RDL structure after removing the carrier substrate; and coupling a second semiconductor package to the first semiconductor package structure by a plurality of first conductive structures that are in contact with the plurality of conductive pillar structures, the second semiconductor package being spaced within 50 microns of the first semiconductor package structure.

23. The method as claimed in claim 22 wherein the first electronic component or the second electronic component comprises a capacitor, an inductor, a resistor, or a combination thereof.

24. The method as claimed in claim 22, further comprising forming a plurality of second conductive structures on the second surface of the first RDL structure.

25. The method as claimed in claim 22, further comprising:
   forming the second semiconductor package, comprising:
      forming a second RDL structure above the first molding compound, wherein the second RDL structure has a third surface and a fourth surface opposite thereto and the fourth surface of the second RDL structure faces the first molding compound;
      mounting a second semiconductor die on the third surface of the second RDL structure; and
      forming a second molding compound on the third surface of the second RDL structure, such that the second semiconductor die is surrounded by the second molding compound.

26. The method as claimed in claim 25, further comprising forming a third semiconductor die on the second semiconductor die, wherein the third semiconductor die is surrounded by the second molding compound.

27. The method as claimed in claim 26, wherein the second and third semiconductor dies comprise a memory device, respectively.

28. The method as claimed in claim 25, further comprising forming the plurality of first conductive structures between the fourth surface of the second RDL structure and the exposed plurality of conductive pillar structures, such that the plurality of first conductive structures are electrically coupled between the plurality of conductive pillar structures and the second RDL structure.

* * * * *